United States Patent [19]

Kroes et al.

[11] Patent Number: 5,173,087

[45] Date of Patent: Dec. 22, 1992

[54] CRYSTAL GROWTH IN A MICROGRAVITY ENVIRONMENT

[75] Inventors: Roger L. Kroes; Donald A. Reiss; Sandor L. Lehoczky, all of Huntsville, Ala.

[73] Assignee: The United States of America as represented by the Administrator of the National Aeronautics and Space Administration, Washington, D.C.

[21] Appl. No.: 717,447

[22] Filed: Jun. 19, 1991

[51] Int. Cl.⁵ .............................................. B01D 9/02
[52] U.S. Cl. .................................... 23/295 R; 23/300; 156/DIG. 62
[58] Field of Search .............. 23/295 R, 300; 156/621, 156/DIG. 62; 422/245

[56] References Cited

U.S. PATENT DOCUMENTS

| | | | |
|---|---|---|---|
| 2,591,067 | 2/1952 | Hermann | 422/245 |
| 3,941,648 | 3/1976 | Blank | 422/245 |
| 4,917,707 | 4/1990 | Claramonte et al. | 156/DIG. 62 |
| 4,919,900 | 4/1990 | Martin et al. | 156/DIG. 62 |

OTHER PUBLICATIONS

*Kirk Othmer Encyclopedia of Chemical Technology*, 3rd Ed., vol. 7, John Wiley & Sons, 1979 pp. 243-251.

Primary Examiner—Gary P. Straub
Assistant Examiner—Stephen G. Kalinchak
Attorney, Agent, or Firm—Robert L. Broad, Jr.; Guy M. Miller; John R. Manning

[57] ABSTRACT

Gravitational phenomena, including convection, sedimentation, and interactions of materials with their containers all affect the crystal growth process. If they are not taken into consideration they can have adverse effects on the quantity and quality of crystals produced. As a practical matter, convection and sedimentation can be completely eliminated only under conditions of low gravity attained during orbital flight. There is, then, an advantage to effecting crystallization in space. But in the absence of of convection in a microgravity environment cooling proceeds by thermal diffusion from the walls to the center of the solution chamber. This renders control of nucleation difficult. Accordingly there is a need for a new and improved nucleation process in space. Herein crystals are nucleated by creating a small localized region of high relative supersaturation in a host solution at a lower degree of supersaturation.

3 Claims, 1 Drawing Sheet

CRYSTAL GROWTH IN A MICROGRAVITY ENVIRONMENT

ORIGIN OF THE INVENTION

The Invention described herein was made by employees of the United States Government, and may be manufactured and used by or for Government purposes without the payment of any royalties thereon of therefor.

BACKGROUND OF THE INVENTION

This invention relates to crystallization. Crystalline solids have many desirable properties such as purity, size, shape, color, and processability which are commercially advantageous. In addition for many materials crystallization is the best and cheapest method for producing that material industrially.

Crystallization, a process whereby a solid separates from a solution, is well known. Conditions are imposed on the solution which allow a solid phase of crystalline particles to grow from atoms to a size sufficiently large to allow separation by physical methods. The basic principle behind crystallization is that a solution containing one or more solutes is altered by either cooling, removal of solvent, or addition of another substance so that the ability of the solvent to dissolve the solute is reduced, and a fraction of the solute forms a solid phase which can be removed from the mixture. In other words, if a solution in equilibrium between its solid and liquid phases is altered in such a way that the amount of dissolved solids exceeds the equilibrium concentration, the system will seek to reestablish an equilibrium condition by getting rid of the excess solids. The resulting process is crystallization, and the concentration excess, termed supersaturation, is the driving force.

The quantity of solid matter which a liquid can dissolve and the effect on this quantity of changes in temperature, pressure, particle size, and the presence of foreign substances are not predictable. Gravitational phenomena, including convection, sedimentation, and interactions of materials with their containers all affect the crystal growth process. If they are not taken into consideration they can have adverse effects on the quality and on crystal production because both the material transport and the crystal growth process are dominated by gravity-driven convection. The crystallization process, is also strongly affected by the presence and behavior of buoyancy-driven convection. Unless precautions are taken to suppress convection currents, undesirable results are possible.

As a practical matter, convection and sedimentation can be completely eliminated most directly under conditions of low gravity attained during orbital flight. For this reason it is believed that higher quality forms of crystals and drugs can be manufactured in orbit, that is, under microgravity conditions. Consequently there is much current interest and experimentation in crystallization processes conducted without gravitational effects. Such crystallization processes are deemed to lead to better control of the quality and properties of crystals. Electronic measurements on these crystals characterize the crystalline perfection, and thus help to establish the influence of microgravity on crystal growth. Microgravity is about one/millionth the level of gravity on earth. The term "zero gravity" is often used where microgravity is the correct term.

There is one disadvantage to crystallization in space. That is the nucleation process. Because of the absence of convection in a microgravity environment, cooling proceeds by thermal diffusion from the cold walls to the center of the solution chamber. Nucleation, which will first begin where the temperature is the lowest, will occur on and near the chamber walls. Crystals, which nucleate heterogeneously on the walls, will have their growth modified and interfered with by their attachment to the wall. There is, then, a need for a new and improved nucleation process in space. By this invention such a nucleation process is provided.

SUMMARY OF THE INVENTION

Crystallization processes in microgravity involve cooling a solution to produce supersaturation sufficient to induce nucleation of crystals of the desired substance. Because of the absence of convection in a microgravity environment, cooling proceeds by thermal diffusion from the walls inwardly. This creates a temperature gradient from the walls to the solution chamber center. Crystals which form in this temperature gradient will be nucleated at different times, and possibly at different degrees of supersaturation as the cool front moves through the solution. In any event the nucleation process can not be localized, and the process is not easy to control.

Herein crystals are nucleated by creating a small localized region of high relative supersaturation in a host solution at a lower degree of supersaturation. A process for effecting nucleation of crystals in microgravity is provided where buoyancy driven convection does not exist, and crystal growth is achieved by diffusion. The process includes forming a supersaturated solution of solute in a solvent by concentrating it to its state of metastable supersaturation. In a localized region of said metastable solution an increase in solute concentration is effected so that in that localized region a portion of the solution exceeds the metastable concentration. That equilibrium departure is the driving force bringing about nucleation in the localized zone.

DETAILED DESCRIPTION OF THE INVENTION

In an earth orbiting spacecraft convection and sedimentation become negligibly small. Diffusion is the predominant mechanism of transport. Crystals can be grown by solute diffusion, but nucleation remains difficult to control. The energetics of nucleation leads to an atomistic cluster which grows to a nucleus with an increase in solute concentration. An equilibrium exists between the solute and the solvent at saturation. At the saturation temperature solute and mother liquor coexist in thermodynamic equilibrium. According to theory this is a definite region of low driving force in which no crystal growth takes place. At a departure from this equilibrium condition existing crystals grow, but new crystals do not nucleate. This is the metastable region of supersaturation. Once the solute concentration exceeds the equilibrium for this metastable region the nucleation rate increases exponentially with increased concentration. Thus at a certain definite departure from the metastable supersaturation state a homogeneous system will become critical and nucleate crystallites. To reach this concentration the solution is either cooled or evaporated until it is sufficiently supersaturated for spontaneous nucleation.

In a microgravity environment the absence of convective heat transfer produces some undesirable results.

Solution cooling and the resulting supersaturation proceed by diffusion. Solution adjacent to a cooled wall, or fluid-gas interface will have a localized increase in its supersaturation. The proximity of solid surfaces or fluid-gas interfaces to the nucleated crystals tends to distort the mass diffusion fields around the crystals. This results in the nucleation of uncontrolled numbers of crystals on the surfaces, such as the walls of the container, or on the free surface of the liquid. The nucleation of large numbers of crystals at one time limits the size to which the crystals will grow by rapidly depleting the solution of solute. This is particularly troublesome in protein crystal growth where the production of large crystals is the purpose for using microgravity.

By the practice of this invention the metastable state of supersaturation is exceeded in a highly localized area of the metastable solution. In this high supersaturation location within the less supersaturated (metastable) host solution nucleation will occur. This localized region persists long enough for nucleation to occur because of the absence of buoyancy-driven convection in microgravity. After nucleation has occurred, diffusion will cause the region of high supersaturation to dissipate. The supersaturation of the solution surrounding the nuclei will then return to the ambient value, preventing further nucleation. Diffusion-controlled growth of the few crystals nucleated in the local zone will then proceed in the metastable supersaturated solution without interference from surfaces.

The first Skylab III demonstration was diffusion in liquids. In Skylab IV Rochelle salt growth tests were conducted. Crystal growth experiments were also developed to investigate PbS, CaCO3 and TTF-TCNQ. Each of these crystals are technologically important. PbS is a semiconductor, and CaCO3 has useful optical properties. The important property of TTF-TCNQ is its one-dimensional electrical conductivity. A significant observation in microgravity experiments was that combined effects of vehicular motion, crew motion, thruster firings to dump angular momentum from the accumulation of gravity gradient torques, and other sources of acceleration or g-jitter integrated over three days did not produce any discernible mixing. They do not, therefore, affect the nucleation process herein.

PREFERRED EMBODIMENT OF THE INVENTION

There are two methods for creating a small localized region of high relative saturation which exceeds the metastable supersaturation state in a host supersaturated solution. One method is to introduce a small amount of a solution which is saturated at a higher temperature than the host solution. Another method is to cool only a small portion of the localized area.

Figure 1:
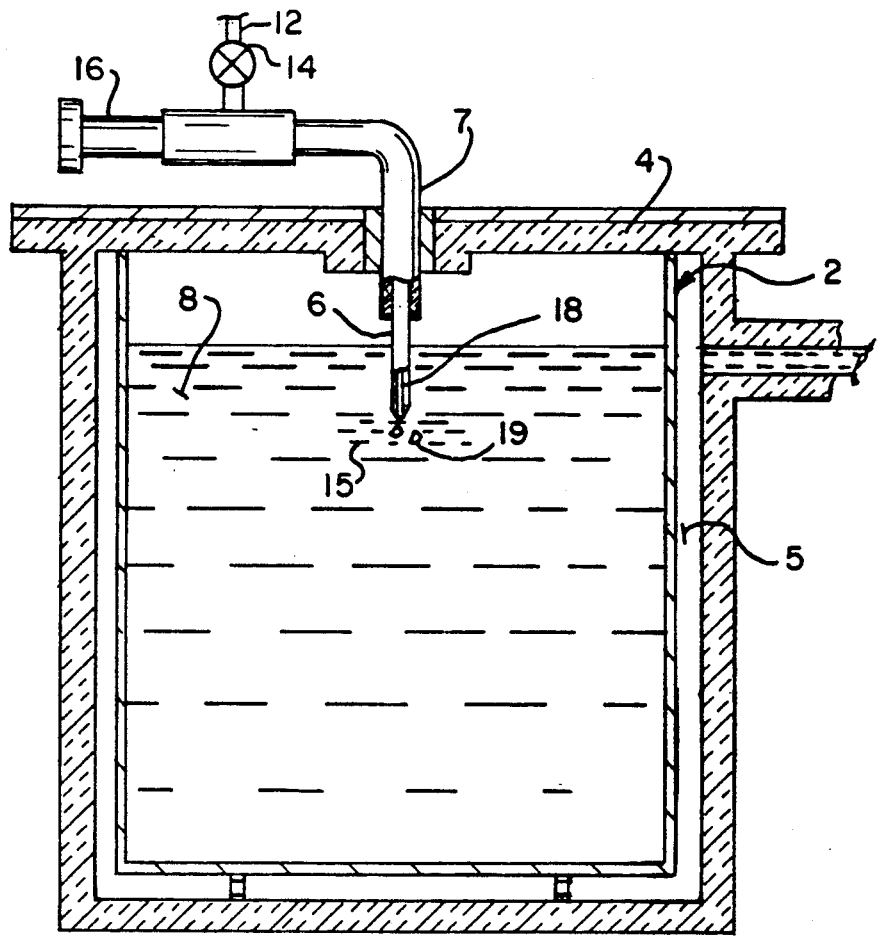
FIG. 1 is a schematic view, partially in section, of a cooling chamber adapted for use in the first method.

A preferred embodiment of the invention is that shown in FIG. 1. It can, perhaps, best be understood from a discussion in conjunction with that figure.

Cooling chamber 2, provided with insulation 4, is provided with a hollow needle 6 which is also insulated, at 7. The needle tip is inserted into a body of supersaturated growth solution 8 in chamber 2. Line 12, through valve 14, is connected to a hot saturated solution reservoir, not shown. By means of plunger 16 a small amount of the hot saturated solution from the solute reservoir is injected into the lower temperature supersaturated growth solution 8 through tip 18 of hollow needle 6. This small quantity of hotter saturated solution produces a local region 15 of high supersaturation as it cools to the temperature of the host solution. The thermal diffusivity is larger than the mass diffusivity. Therefore, when the drop or drops (small quantity) of hot, concentrated solution enters the cooler, less concentrated, but metastable host solution 8, the drop cools and exceeds its own metastable region of supersaturation before the concentration can be reduced by mass diffusion into the solution 8. This high degree of supersaturation exceeding the metastable state results in nucleation of crystals 19. Since host solution 8 is metastably supersaturated these crystals can then grow in vessel or cooling chamber 2. Crystals are thus nucleated only in specific locations, and in controlled numbers only. This prevents the nucleation of crystals on solid surfaces, or in such large numbers that they deplete the solution before growing to useful sizes. In microgravity the crystals grow suspended in the host solution so that there is no contact with solid surfaces during growth.

Figure 2:
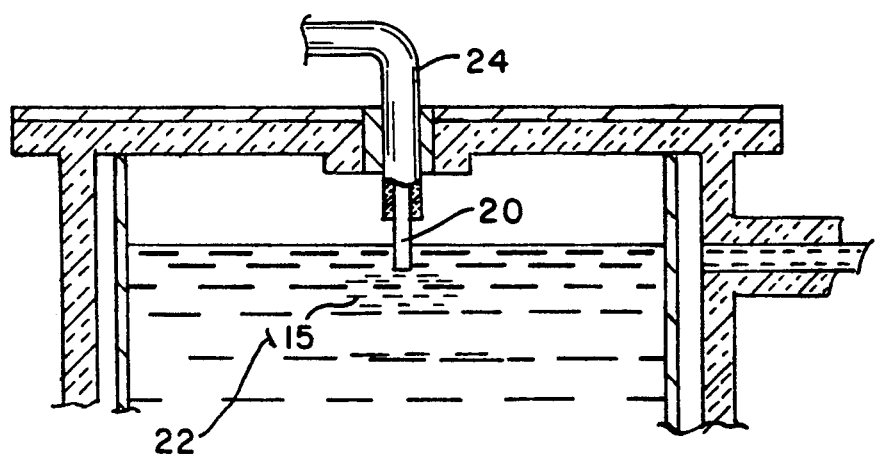
FIG. 2 is a view, partially cut away, showing the second method.

An alternate embodiment of this invention, shown in FIG. 2, includes the insertion of a cooled rod 20 into the host solution. Thus, instead of being a hollow needle, element 20 can be a cooled tip of a rod. The insertion of an insulated (24) rod 20 with a cold tip into a supersaturated solution results in cooling an area 15 surrounding the rod. Since thermal diffusion in a fluid is faster than mass diffusion, the solution adjacent the depleted region will cool, and hence, as in the first embodiment, will exceed the metastable supersaturation state before mass diffusion depletes that part of the solution. Nucleation will then occur in that region only, the effect being similar to the hot fluid injection method. The growth of a crystal, or crystals, so nucleated will form a solute-depleted region adjacent the growing face. This region will remain stable in the convection-free microgravity environment.

In the light of the teachings of this invention ramifications and modifications will occur to those in this field. As an example various crystallization vessels can be used, for instance glove boxes and the like. Further, in addition to the proteins and other crystals mentioned hereinbefore, the invention herein is applicable to any of the usual inorganic crystals such as potassium sulfates, aluminum sulfate, sodium sulfate, barium bromide, barium iodide, beryllium sulfate, beryllium chloride, cadmium nitrate and the like. In addition organic crystals are within the contemplation of the invention, for example, acetamide, benzoic acid, cinnamic acid, glutamic acid, glycine, oxalic acid, salicylic acid, tartaric acid, urea and others. Such ramifications are deemed to be within the scope of this invention.

What is claimed is:

1. A process for effecting nucleation in microgravity crystallization where buoyancy-driven convection does not exist, which comprises cooling a solution of solute in a solvent in a cooling chamber to the saturation temperature and then further cooling that saturated solution to a state of metastable supersaturation thus forming a metastable host solution, then in a local region injecting a saturated solution of solute at a saturation temperature above the temperature of the metastable host solution into the lower temperature host solution, thus exceeding the metastable limit of saturation at the point of injection to form crystals in that local region before its concentration can be reduced by mass diffusion into the host solution, wherein said local region is located so that no contact occurs between the crystals and the solid surfaces of the cooling chamber.

2. A process for effecting nucleation in microgravity crystallization where buoyancy-driven convection does not exist, which comprises cooling a solution of solute in a solvent in a cooling chamber to the saturation temperature and then further cooling that saturated solution to a state of metastable supersaturation thus forming a metastable host solution, initiating nucleation and crystal growth in a local region by cooling that local region as the remaining metastable host solution does not exceed its metastable limit of supersaturation and said local region is located so that no contact occurs between the crystals and the solid surfaces of the cooling chamber.

3. The process of claim 2 wherein the local region in the metastable host solution is cooled by inserting into the local region an element colder than the local region.

* * * * *